United States Patent
Magni et al.

(10) Patent No.: US 8,291,921 B2
(45) Date of Patent: Oct. 23, 2012

(54) REMOVING BUBBLES FROM A FLUID FLOWING DOWN THROUGH A PLENUM

(75) Inventors: Encrico Magni, Pleasanton, CA (US); Russell Martin, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 533 days.

(21) Appl. No.: 12/194,308

(22) Filed: Aug. 19, 2008

(65) Prior Publication Data

US 2010/0043822 A1  Feb. 25, 2010

(51) Int. Cl.
*B08B 3/04* (2006.01)
(52) U.S. Cl. ............... 134/94.1; 118/300; 134/104.2
(58) Field of Classification Search ........... 239/398; 266/200, 207, 208; 134/1.3, 21, 49, 104.2, 134/60, 94.1; 34/566; 118/300
See application file for complete search history.

(56) References Cited

U.S. PATENT DOCUMENTS

| | | | |
|---|---|---|---|
| 6,478,035 B1 | 11/2002 | Niuya et al. | |
| 6,521,050 B1 * | 2/2003 | Mikhaylichenko et al. | .... 134/18 |
| 6,861,027 B2 | 3/2005 | Weaver et al. | |
| 2002/0139525 A1 * | 10/2002 | Erick | ............... 166/68 |
| 2004/0060580 A1 * | 4/2004 | Woods | .............. 134/30 |
| 2005/0167265 A1 * | 8/2005 | Wilson et al. | ............ 204/222 |
| 2006/0064895 A1 * | 3/2006 | Garcia et al. | ............... 34/566 |
| 2007/0000387 A1 | 1/2007 | Farber et al. | |
| 2008/0169230 A1 | 7/2008 | Nakagawa | |

OTHER PUBLICATIONS

International Search Report (Oct. 6, 2009).

* cited by examiner

*Primary Examiner* — Michael Kornakov
*Assistant Examiner* — Douglas Lee
(74) *Attorney, Agent, or Firm* — Martine Penilla Group, LLP

(57) ABSTRACT

In an example embodiment, a top proximity head for depositing fluids on a semiconductor wafer includes a delivery bore which receives fluid. The top proximity head includes a plenum that is connected to the delivery bore by numerous input channels into which fluid flows from the delivery bore. Each input channel has an inverted V-shaped opening which urges the upward flow of any air bubbles. From the plenum, the fluid flows through output channels out of the top proximity head to form a meniscus. The fluid is suctioned from the meniscus back into the top proximity head through return channels that lead to a return bore. A passage connects the delivery bore with the return bore, allowing air bubbles to escape from the delivery bore into the return bore. The passage allows a negligible amount of fluid to flow directly between the two bores rather than through the plenum.

8 Claims, 13 Drawing Sheets

REMOVING BUBBLES FROM A FLUID FLOWING DOWN THROUGH A PLENUM

BACKGROUND

As described in related patent applications, a linear wet-deposition system has been developed to deposit fluids (e.g., water-based or solvent-based) onto a single semiconductor wafer with a pair of proximity heads located above and below the wafer. In particular implementations of the system, the proximity heads facilitate the formation and maintenance of a fluid meniscus or film on a semiconductor wafer. See e.g., U.S. application Ser. No. 11/820,590 entitled "System, Method and Apparatus for Maintaining Separation of Liquids in a Controlled Meniscus" filed on Jun. 19, 2007, which is hereby incorporated by reference.

In some instances, a proximity head in a linear wet system is configured to deposit material in only one phase, namely, liquid (e.g., water, deionized water, water-based chemistries, or solvent-based chemistries); that is to say, the deposited fluid should be devoid of material in a gas phase. However, during operation of such a system, air bubbles (e.g., material in a gas phase) can become trapped in the proximity head located above the wafer and then can accumulate on the surface of a wafer, which tends to be both hydrophobic and oleophobic. These bubbles represent a volume on the wafer surface where uniform deposition of the fluid cannot occur.

Consequently, there is a need for a wet-deposition system which does not allow the accumulation of air bubbles when depositing an air-free fluid onto a semiconductor wafer with a proximity head located above the semiconductor wafer. However, the invention claimed below has wide applicability to other applications beyond this particular application, as will become apparent from the following description and the drawings which accompany it.

SUMMARY

Example embodiments include apparatuses, systems, and methods directed to the elimination of air bubbles from the surface of a semiconductor wafer onto which an air-free fluid is deposited by a proximity head located above the wafer. In one example embodiment, a top proximity head includes a delivery bore which receives the air-free fluid pumped from a source outside the head. The top proximity head additionally includes a plenum that is connected to the delivery bore by numerous input channels into which fluid flows downward from the delivery bore. In particular example embodiments, each of the input channels has an inverted V-shaped opening which urges the upward flow of any air bubbles in the plenum. From the plenum, the fluid flows out of the top proximity head through output channels to form a meniscus or film on the semiconductor wafer for operations such as cleaning, rinsing, and/or Marangoni drying. In example embodiments, the fluid is suctioned from the meniscus back into the top proximity head through return channels that lead to a return bore, which outputs the fluid from the head. A passage connects the delivery bore with the return bore allowing air bubbles to escape from the delivery bore into the return bore. The connecting passage allows a negligible amount of fluid to flow directly between the two bores rather than through the plenum.

In alternative example embodiments, the fluid might be used for operations such as etching, plating, or lithography, rather than cleaning, rinsing, and/or Marangoni drying. In these example embodiments, the fluid might be deposited on the semiconductor wafer without forming a meniscus or film on the semiconductor wafer. The fluid suctioned and output from the proximity head by a suction bore would consist of the negligible amount of fluid flowing directly between the delivery bore to the suction bore through the connecting passage.

Regardless of whether a meniscus is formed, the top proximity head might be made free of air bubbles by a series (e.g., 10-15) of alternating cycles of fluid delivery and idle time, in particular example embodiments.

The advantages of the present invention will become apparent from the following detailed description, which taken in conjunction with the accompanying drawings, illustrates the principles of the invention by way of example.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, implementation details and process operations have not been described in detail, if already well known.

Figure 1A:
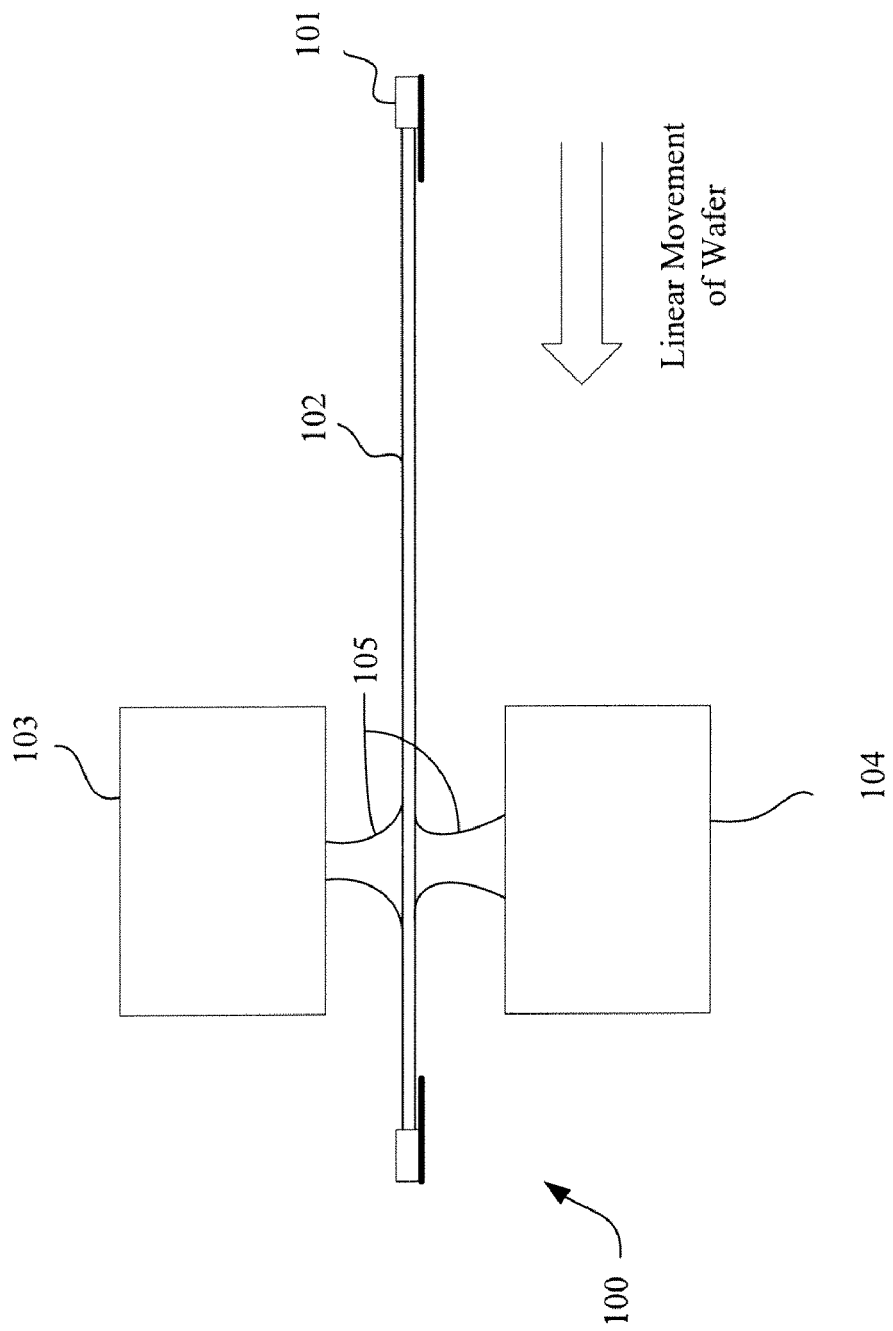
FIG. 1A is a simplified schematic diagram illustrating a linear wet system with a pair of proximity heads for depositing fluid onto a semiconductor wafer, in accordance with an example embodiment.

FIG. 1A is a simplified schematic diagram illustrating a linear wet system with a pair of proximity heads for depositing fluid onto a semiconductor wafer, in accordance with an example embodiment. In FIG. 1A, a linear wet system 100 includes a top proximity head 103 and a bottom proximity head 104. Each of these proximity heads forms a meniscus 105 through which a semiconductor wafer 102 is linearly transported by a carrier 101. It will be appreciated that air bubbles tend not to get trapped in the bottom proximity head 104 (e.g. the proximity head beneath the semiconductor wafer) since air tends to be lighter than fluids and hence tends to rise during system idle time between fluid deliveries (e.g., when a meniscus is not present). Consequently, the example embodiments described below do not directly involve the bottom proximity head and that proximity head is not shown in the corresponding drawings, though the system might include both a bottom proximity head and a top proximity head.

Figure 1B:
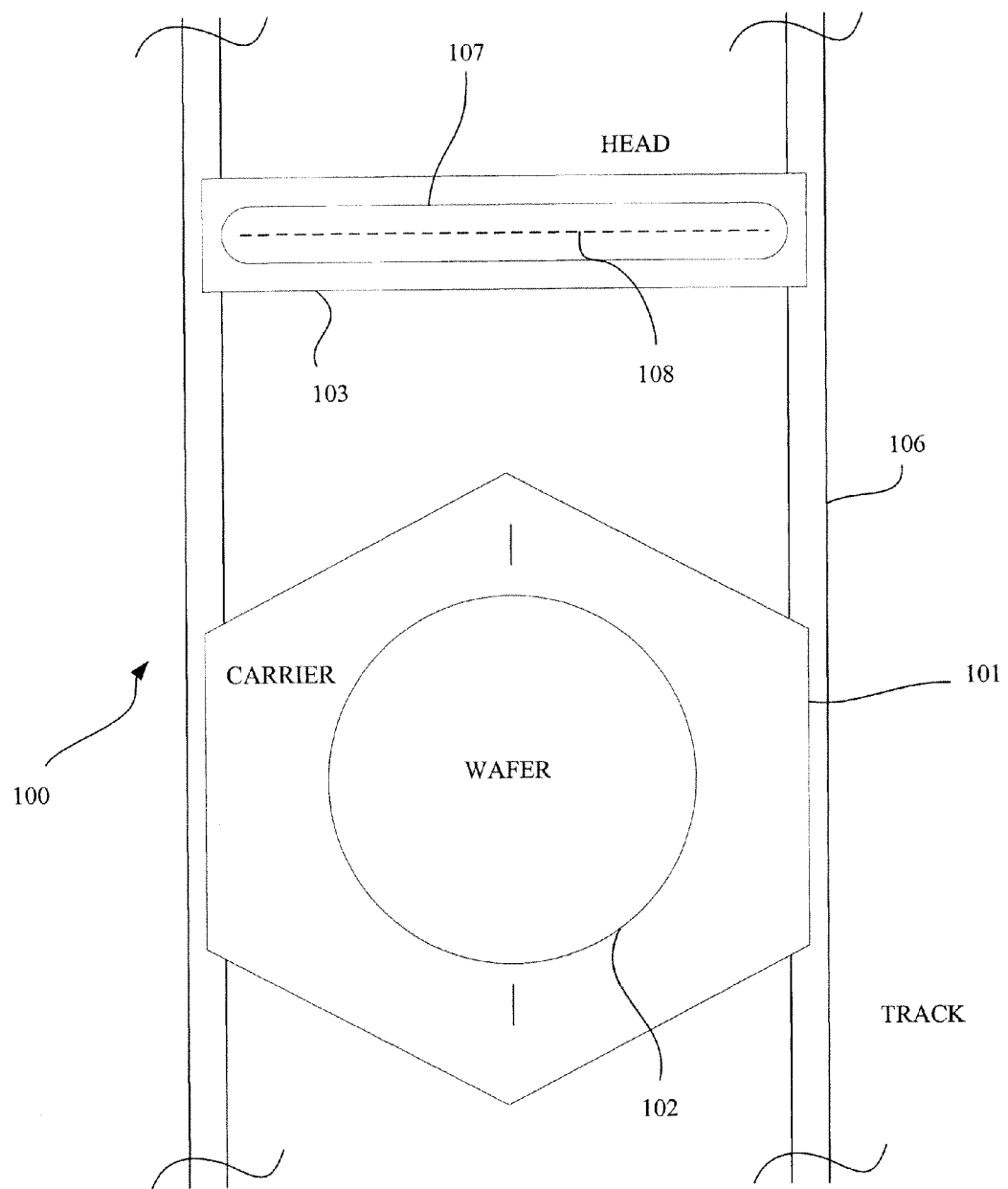
FIG. 1B is a simplified schematic diagram illustrating an overhead view of a carrier and a proximity head in a linear wet system, in accordance with an example embodiment.

FIG. 1B is a simplified schematic diagram illustrating an overhead view of a carrier and a proximity head in a linear wet system, in accordance with an example embodiment. As shown in this figure, a carrier 101 transports a semiconductor wafer 102 along a pair of tracks 106 in a linear wet system 100, beneath a top proximity head 103, which is shown in cross-section. In this example embodiment, the cross-section of the top proximity head 103 includes an oval 107 of output channels that will deposit fluid onto the wafer 102, forming a meniscus or film. The cross-section of the top proximity head 103 also includes a row 108 of return channels that will suction the fluid (e.g., using a partial vacuum) from the wafer once it has been deposited. In an alternative example embodiment, the oval 107 of output channels might be located between two ovals of return channels, in an arrangement involving both an inner and outer return. Other arrangements of the output channels and the return channels might also be used to create a meniscus as described in related patent applications.

Figure 2:
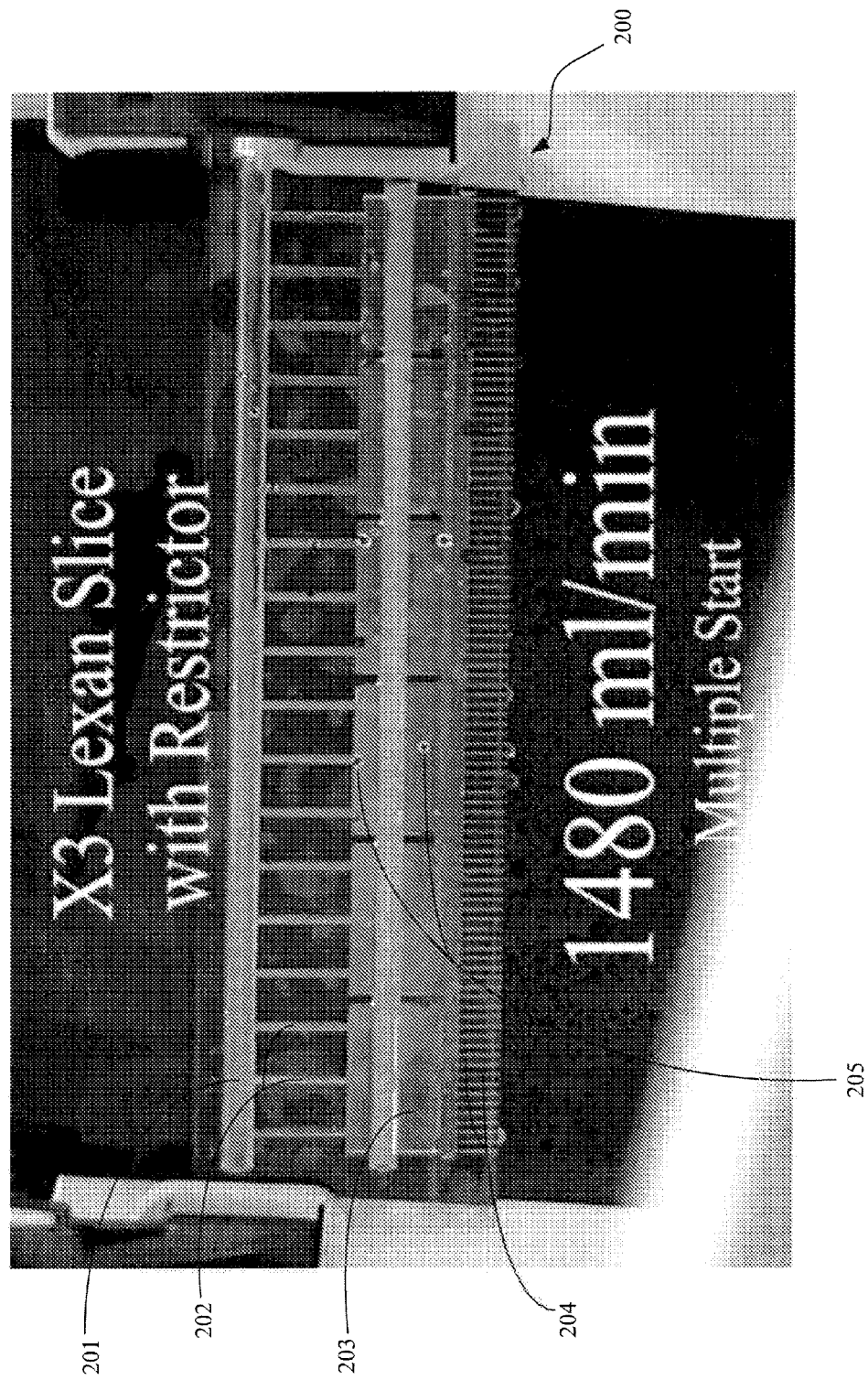
FIG. 2 is a cross-sectional diagram showing air bubbles in the plenum of a top proximity head.

FIG. 2 is a cross-sectional diagram showing air bubbles in the plenum of a top proximity head. In FIG. 2, the system pumps fluid into a top proximity head 200 through a delivery bore 201. From the delivery bore 201, the fluid flows down through input channels 202 into a plenum 203. From the plenum 203, the fluid flows out of the top proximity head 200 through output channels 204 to form a meniscus, which is not shown in FIG. 2. Shown in FIG. 2 are air bubbles 205 which might have formed during the idle time between fluid deliveries into the top proximity head 200 (e.g., when a meniscus is not present). Such air bubbles 205 tend to rise toward the delivery bore 201 during the idle time and often become trapped where the input channels 202 enter the plenum 203. Then when the next fluid delivery occurs, the air bubbles 205 are pushed down through the output channels 204 where they can accumulate on a semiconductor wafer and thwart uniform deposition of the fluid.

Figure 3:
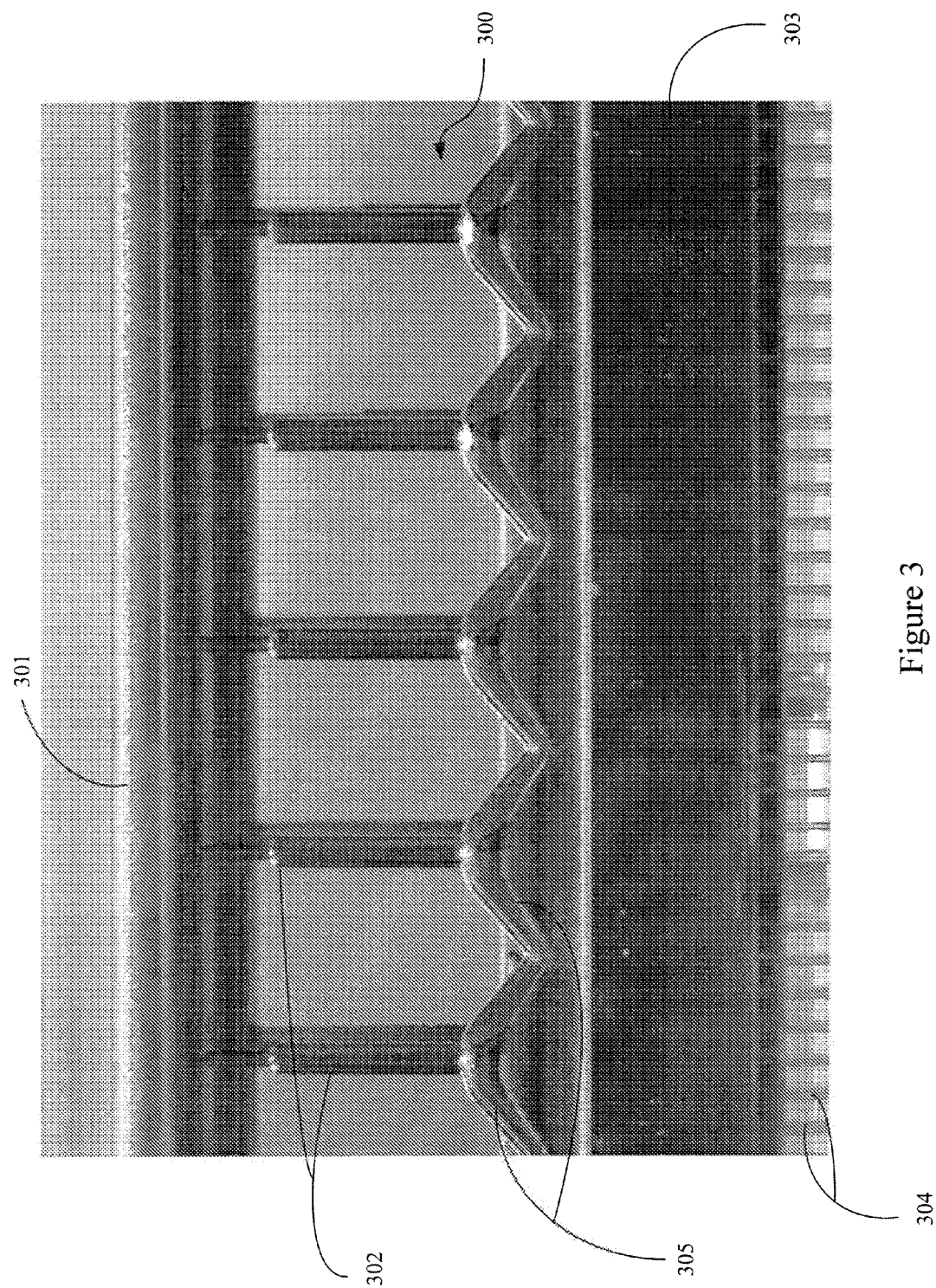
FIG. 3 is a cross-sectional diagram showing inverted V-shaped openings into the plenum of a top proximity head, in accordance with an example embodiment.

FIG. 3 is a cross-sectional diagram showing inverted V-shaped openings into the plenum of a top proximity head, in accordance with an example embodiment. In FIG. 3, a top proximity head 300 includes a delivery bore 301 connected by input channels 302 to a plenum 303 which, in turn, is connected to output channels 304. However, in this example embodiment, the top proximity head 300 also includes inverted V-shaped openings 305 which facilitate the upward flow of air bubbles into the input channels 302 and ultimately into the delivery bore 301. In particular example embodiments, the angle between the sides of the inverted V and a line bisecting the V is approximately 45 degrees. It will be appreciated that the angle is dependent on materials, delivery flow rate, etc., and is not unique. In particular example embodiments, the components of the proximity head 300 might be made from highly nonreactive thermoplastic materials such as (a) polyvinylidene chloride (PVDF), which is also called KYNAR or HYLAR or SYGEF, or (b) ethylene chlorotrifluoroethlyene (ECTFE), which is also called halar.

Figure 4:
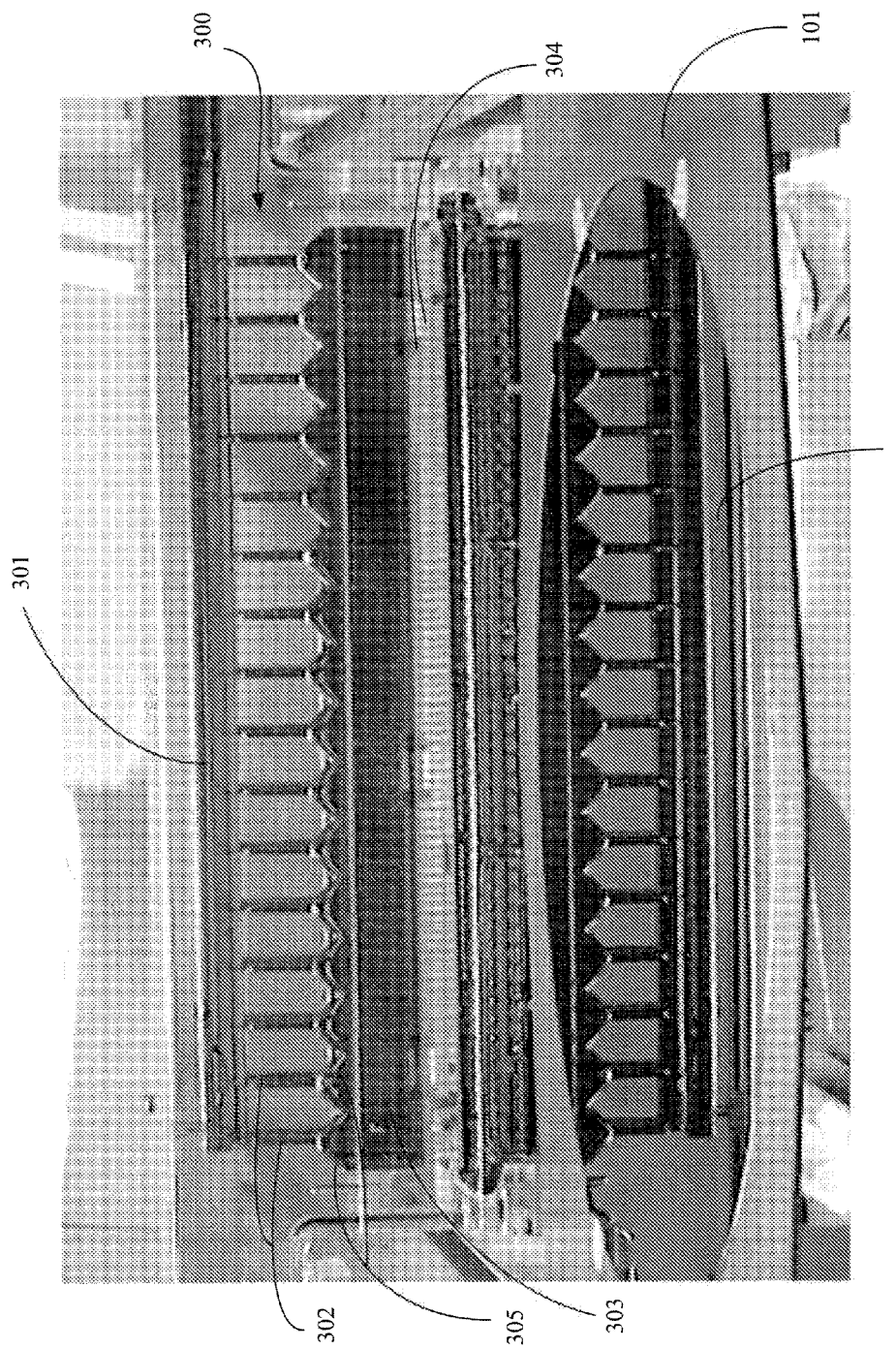
FIG. 4 is a perspective diagram showing a cross-section of a top proximity head and a semiconductor wafer on a carrier, in accordance with an example embodiment.

FIG. 4 is a perspective diagram showing a cross-section of a top proximity head and a semiconductor wafer, in accordance with an example embodiment. In FIG. 4, a top proximity head 300 includes a delivery bore 301 connected by input channels 302 to a plenum 303 which, in turn, is connected to output channels 304. Here again, the top proximity head 300 also includes inverted V-shaped openings 305 which facilitate the upward flow of air bubbles into the input channels 302 and ultimately into the delivery bore 301. Also shown in FIG. 4 are a semiconductor wafer 102 and a carrier 101 which the system uses to position the semiconductor wafer 102 under the top proximity head 300.

Figure 5A:
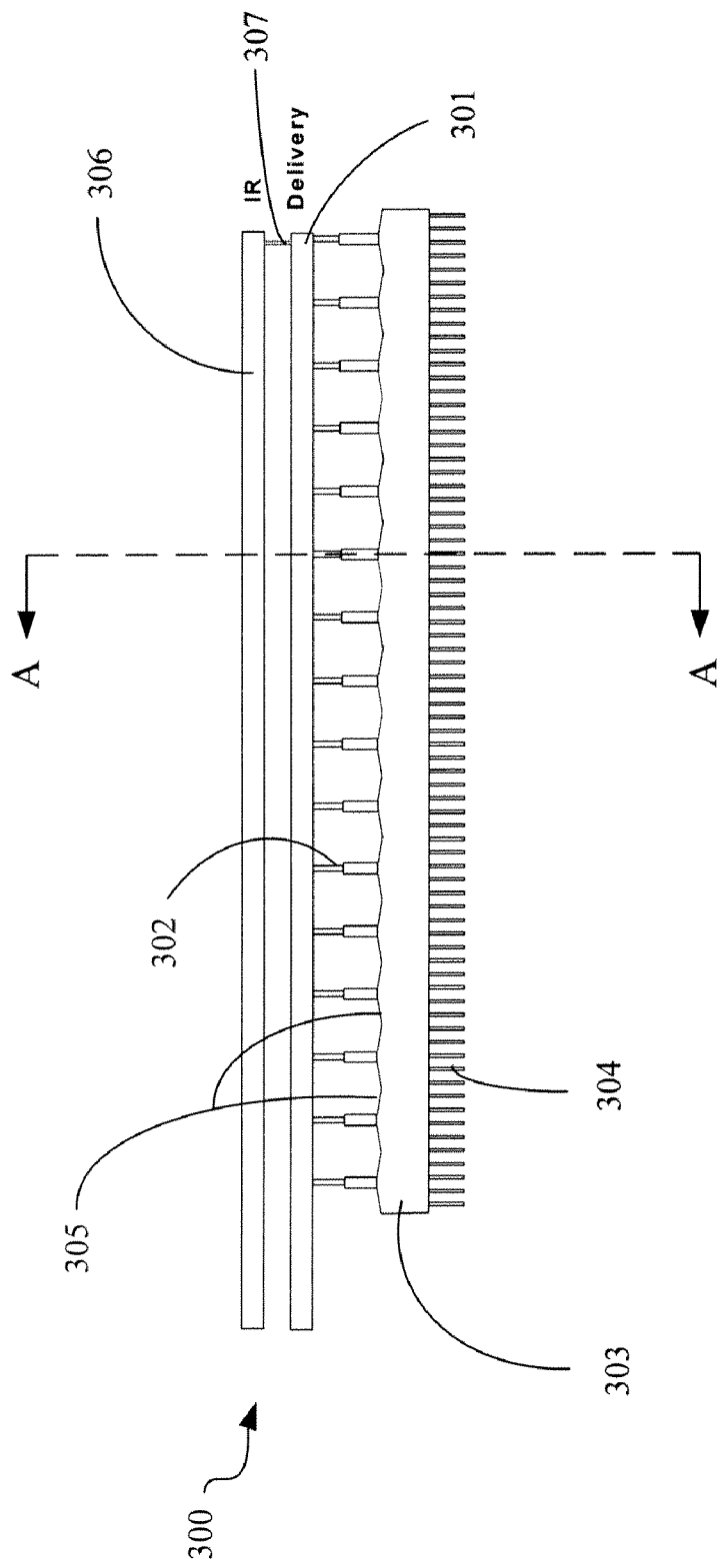
FIG. 5A is a schematic diagram illustrating a connecting passage between a delivery bore and a return bore in a top proximity head, in accordance with an example embodiment.

FIG. 5A is a schematic diagram illustrating a connecting passage between a delivery bore and a return bore in a top proximity head, in accordance with an example embodiment. In FIG. 5, a top proximity head 300 includes a delivery bore 301 and a return bore 306 (here labeled IR for inner return), connected by a passage 307. Also shown in FIG. 5 are input channels 302, plenum 303, and output channels 304 in the top proximity head 300. Above the plenum 303 are the inverted V-shaped openings 305 which the system uses to urge air bubbles upwards into the delivery bore 301, through the connecting passage 307, and ultimately into the return bore 306.

Figure 5B:
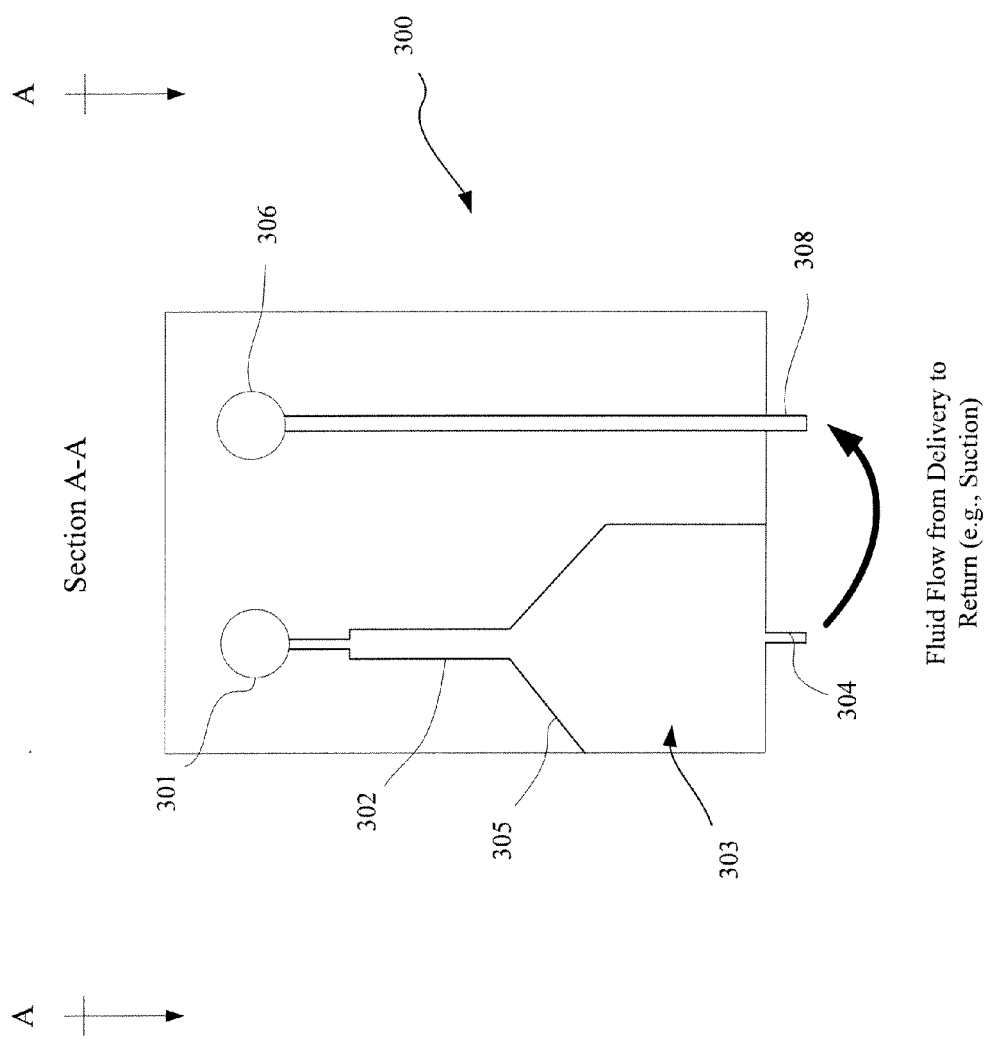
FIG. 5B is a schematic diagram illustrating a delivery bore and a return bore in a cross-section of a top proximity head, in accordance with an example embodiment.

FIG. 5B is a schematic diagram illustrating a delivery bore and a return bore in a cross-section of a top proximity head, in accordance with an example embodiment. It will be appreciated that FIG. 5B corresponds to the A-A cutting plane in FIG. 5A. In FIG. 5B, a top proximity head 300 includes a delivery bore 301 that is connected to an input channel 302, which in turn is connected to a plenum 303 that is connected to an output channel 304. The input channel 302 ends in an inverted V-shaped opening 305. Also depicted in Figure B is a return bore 306 that is connected to a return channel 308. As shown in the figure, fluid flows from the output channel 304 to the return channel 308. In an example embodiment, the fluid forms a film or meniscus on a wafer. In another example embodiment discussed elsewhere, the fluid might merely be deposited on a wafer.

Figure 6:
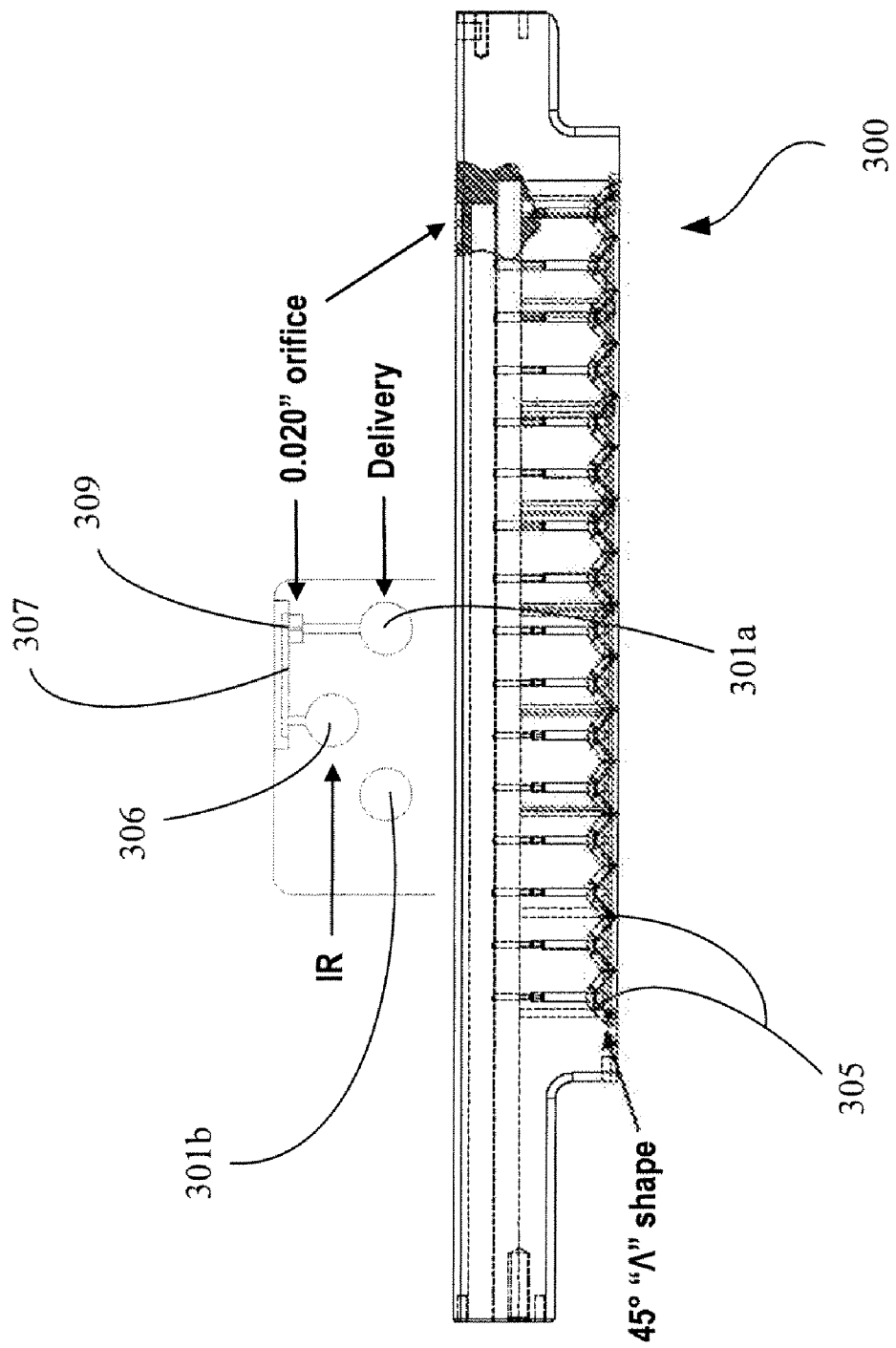
FIG. 6 is a schematic diagram also illustrating a connecting passage between a delivery bore and a return bore, in accordance with an example embodiment.

FIG. 6 is a schematic diagram also illustrating a connecting passage between a delivery bore and a return bore, in accordance with an example embodiment. In FIG. 6, a top proximity head 300 includes a delivery bore 301a and a return bore 306 (again labeled IR for inner return), connected by a passage 307. The passage includes an orifice 309 that is approximately 0.02 inch wide, e.g., sufficient to create a 5 torr differential pressure between the delivery bore 301a and the return bore 306 sufficient to overcome capillary and gravitational forces, in an example embodiment. Also shown in FIG. 6 are the inverted V-shaped openings 305 (where the angle between the sides of the inverted V and a line bisecting the V is approximately 45 degrees) which the system uses to urge air bubbles upwards into the delivery bore 301a, through the connecting passage 307, and ultimately into the return bore 306. In an example embodiment, delivery bore 301b might be an additional bore for delivery of a fluid and might be connected to return bore 306 by a connecting passage similar to connecting passage 307, which similar connecting passage is not shown. It will be appreciated that that the width of the orifice 309 is dependent on materials, delivery flow rate, etc., and is not unique.

Figure 7:
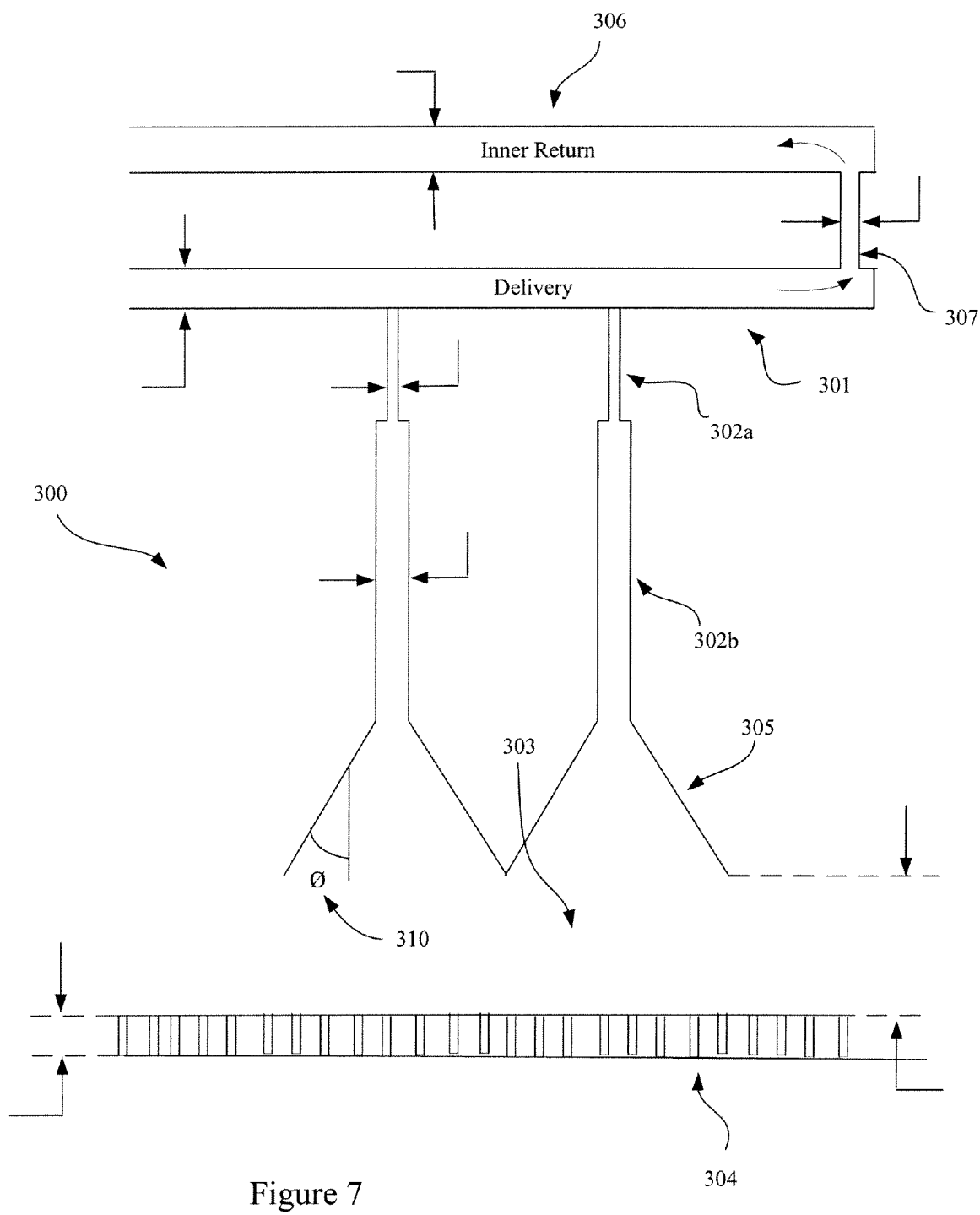
FIG. 7 is a schematic diagram illustrating several dimensions of the fluid delivery network in a top proximity head, in accordance with an example embodiment.

FIG. 7 is a schematic diagram illustrating several dimensions of the fluid delivery network in a top proximity head, in accordance with an example embodiment. As shown in the diagram, a top proximity head 300 includes a delivery bore 301 (e.g., Delivery) connected to both an input channel 302 and a passage 307 which leads to a return bore 306 (e.g., Inner Return). The connecting passage 307 allows a negligible amount of fluid to flow directly between the two bores rather than through the plenum. In an example embodiment, the input channel 302 is connected to the delivery bore 301 by a narrow section 302a that is, in turn, connected to a wide section 302b. The wide section 302b is connected to an inverted V-shaped opening 305, which opens onto the plenum 303. The plenum 303 is, in turn, connected to the output channels 304.

In an example embodiment, the return bore 306 might have a diameter in a wide range, depending on the flow parameters of need. Common diameters vary from 0.250 inches to 0.750 inches. The delivery bore 301 might have an approximate diameter in a range similar to the return bore. The connecting passage 307 might have an approximate opening of 0.02 inches, as described elsewhere. The objective is to provide a restriction such that the conductance to the liquid is small enough to allow only a small fraction of the total delivery flow to go through it, while the conductance to air (or any gas) is high enough to allow for the system to be purged of air (or any gas). This can be accomplished using an orifice with an approximate diameter in the range from 0.005 inches to 0.050 inches. The narrow section 302a might have an approximate diameter in the range from 0.050 inches to 0.125 inches and the wide section 302b might have an approximate diameter in the range from 0.100 inches to 0.250 inches. In an example embodiment, the angle 310 (theta) might be approximately 45 degrees, as described above, though other angles less than 60 degrees might be used in alternative example embodiments. The angle should be around the sliding angle of a 10 microliters drop of the liquid of interest (water, in this case) over the material of interest (PVDF, in this case). Also, in an example embodiment, the plenum 303 might have an approximate height in the range from 0.100 inches to 1.000 inches and the output channels 304 might have an approximate height in the range from 0.100 inches to 1.000 inches. It will be appreciated that FIG. 7 is not drawn to scale.

Figure 8A:
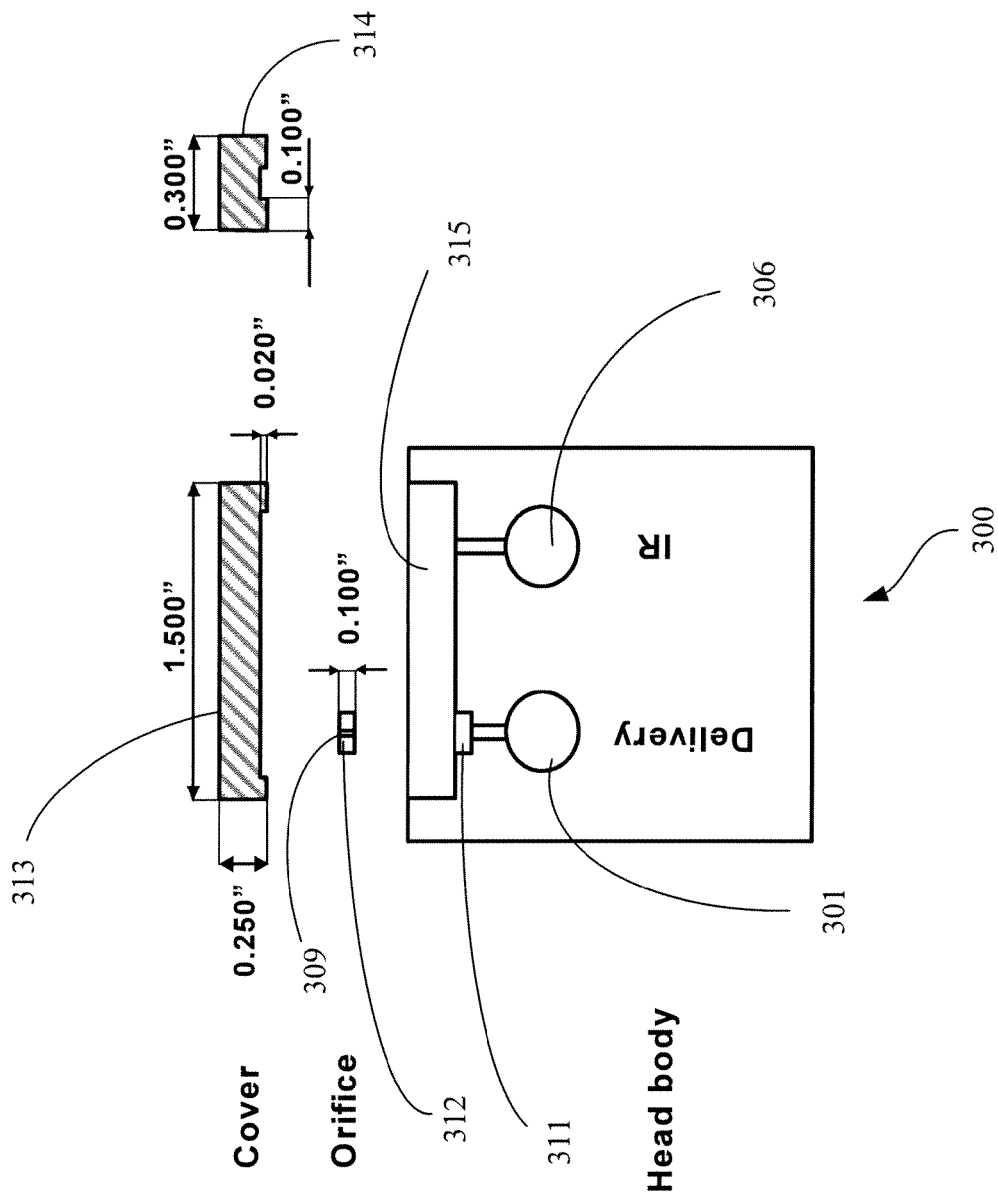
FIG. 8A is a schematic diagram illustrating several dimensions of the connecting passage in a top proximity head, in accordance with an example embodiment.

FIG. 8A is a schematic diagram illustrating several dimensions of the connecting passage in a top proximity head, in accordance with an example embodiment. In FIG. 8A, the connecting passage is created by a cover 313 which fits into a cavity 315 in the body of a top proximity head 300. In an example embodiment, the cover 313 is approximately 1.5 inches wide and approximately 0.25 inches high. The ends 314 of the cover 313 are approximately 0.3 inches wide. The cover 313 (and its ends 314) creates a hollow with the cavity 315. The dimensions of the hollow are approximately 1.5 inches by 0.1 inches by 0.02 inches, in the example embodiment depicted in FIG. 8A. The body of the top proximity head 300 includes a delivery bore 301 and a return bore 306 (labeled IR for inner return) connected by the cavity 315. The delivery bore 301 is connected to a recess 311 into which a restrictor 312 with an orifice 309 fits. In an example embodiment, the height of the restrictor 705 is approximately 0.1 inches and the diameter of the orifice 309 is approximately 0.02 inches. It will be appreciated that the dimensions shown in FIG. 8A are not unique and other suitable dimensions might be used, depending on the materials, the delivery flow rate, etc.

Figure 8B:
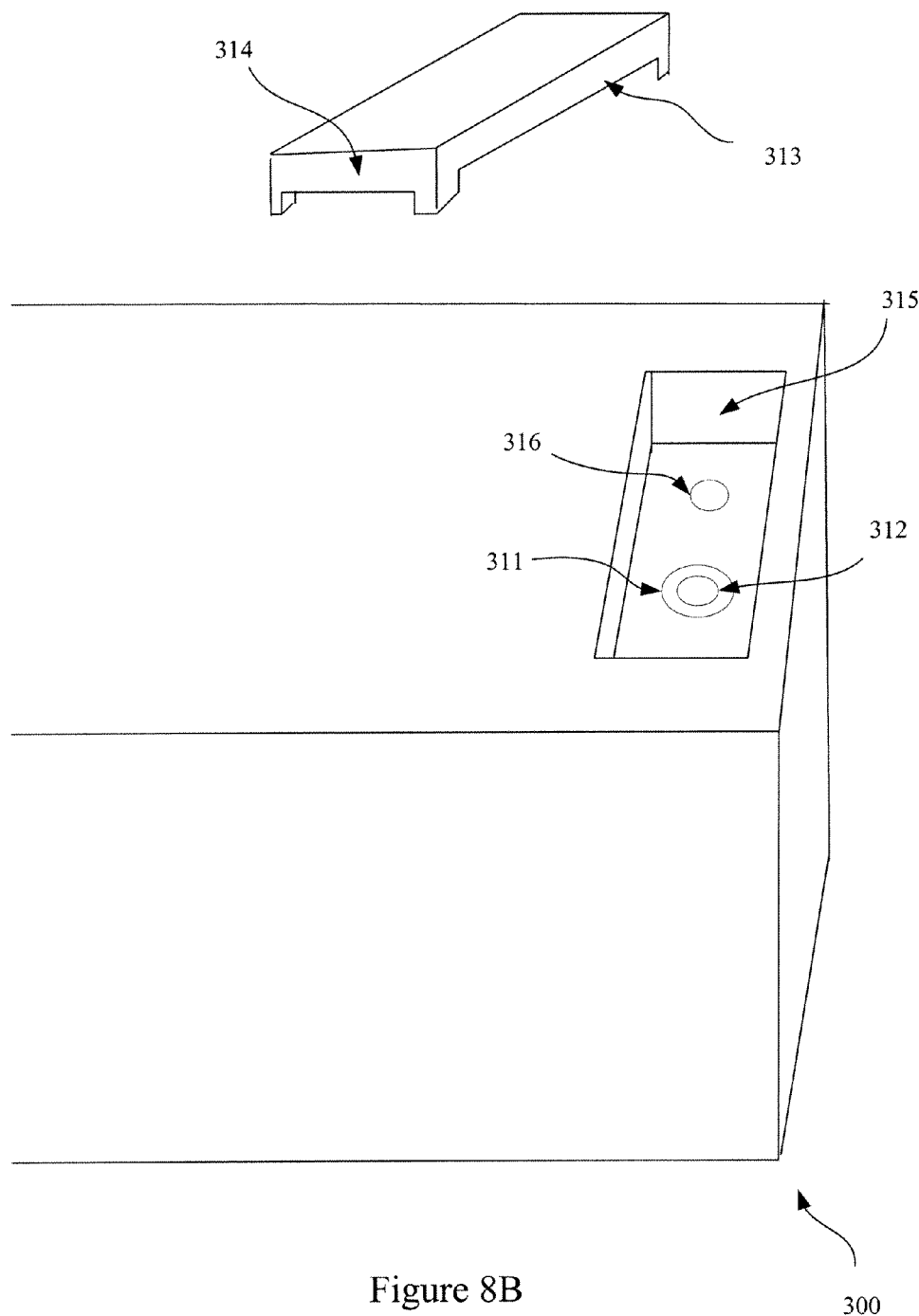
FIG. 8B is a schematic diagram illustrating a cap for a top proximity head, in accordance with an example embodiment.

FIG. 8B is a schematic diagram illustrating a cap for a top proximity head, in accordance with an example embodiment. As shown in the figure, top proximity head 300 includes a cavity 315 that is connected to a recess 311 for a restrictor 312. The cavity also includes an aperture 316 connected to an internal return 306 (which is not shown). Also shown in FIG. 8B is a cap 313 with ends 314. It will be appreciated that the cap 313 (and its ends 314) fits into the cavity 315 when the proximity head 300 is assembled. It will also be appreciated that FIG. 8B is not drawn to scale.

Figure 9:
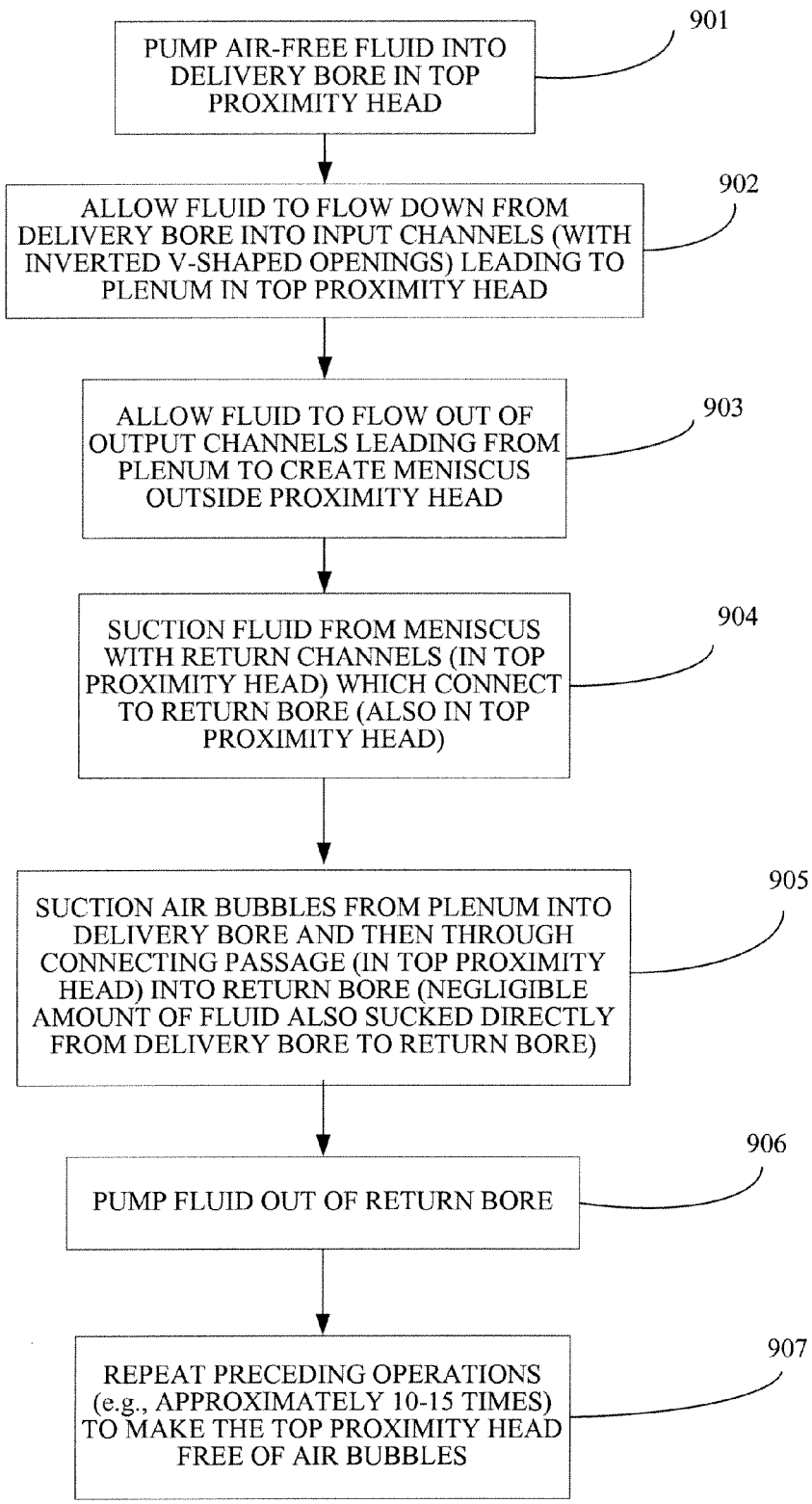
FIG. 9 is a flowchart diagram of a process for removing air bubbles from a fluid flowing down from a top proximity head to a meniscus, in accordance with an example embodiment.

FIG. 9 is a flowchart diagram of a process for removing air bubbles from a fluid flowing down from a top proximity head to a meniscus, in accordance with an example embodiment. In operation 901, the system pumps an air-free fluid into the delivery bore in the top proximity head and, in operation 902, the system allows the fluid to flow down from the delivery bore into input channels leading to a plenum in the top proximity head. In an example embodiment, the input channels end in inverted V-shaped openings which facilitate the upward flow of air bubbles in the plenum. In operation 903, the system allows the fluid to flow down through output channels leading out of the plenum to create a meniscus outside the top proximity head. Then in operation 904, the system suctions the fluid from the semiconductor wafer with return channels in the proximity head that are connected to a return bore which is also in the top proximity head. In operation 905, the system suctions air bubbles from the plenum through the inverted V-shaped openings into the delivery bore, through a connecting passage, and into the return bore. During this operation, a negligible amount of fluid flows directly from the delivery bore into the return bore. Then in operation 906, the system pumps the fluid out of the return bore. In operation 907 of the process, the system repeats operations 901 through 906 (e.g., using them to "strike a meniscus") approximately 10-15 times to make the top proximity head free of air bubbles. Once made free of air bubbles, the top proximity head might remain in that state (e.g., full of fluid) for several hours despite idle time between fluid deliveries.

In an example embodiment, the number of alternating cycles in operation 907 might be dependent upon the delivery flow rate, e.g., a large flow rate requires a smaller number of alternating cycles to make the top proximity head free of air bubbles. In an example embodiment, the fluid delivery flow rate might be approximately 1.5 liter per minute, though alternative example embodiments might handle smaller (e.g., approximately 1 liter per minute) and larger (e.g., approximately 2.4 liter per minute) delivery flow rates. It will be appreciated that the alternating cycles might be thought of as a self-priming of the top proximity head.

In an example embodiment, the top proximity head might use the process in shown in FIG. 9 when depositing cleaning fluids. Such cleaning fluids might be water-based or solvent-based. Such cleaning fluids might include cleaning chemistries such as DIW/hydrogen peroxide, ammonium hydroxide, DIW/HCl/H2O2, DIW/H2SO4/H2O2, DIW/HF, DIW/HF/H2O2, as well as proprietary cleaning chemistries.

In the same or alternative example embodiments, the top proximity head might use the process shown in FIG. 9 when depositing a rinsing fluid such as DIW (deionized water) or IPA (isopropyl alcohol). And in the same or alternative example embodiments, the top proximity head might use the process shown in FIG. 9 when performing Marangoni drying with a drying fluid comprising IPA and nitrogen.

In other alternative example embodiments, the fluid might be used for operations such as etching, plating, or lithography, rather than cleaning, rinsing, and/or Marangoni drying. In these example embodiments, the fluid might be deposited on the semiconductor wafer without forming a meniscus or film on the semiconductor wafer. In these example embodiments, the fluid suctioned and output from the proximity head by a suction bore would consist of the negligible amount of fluid flowing directly between the delivery bore to the suction bore through the connecting passage.

Figure 10:
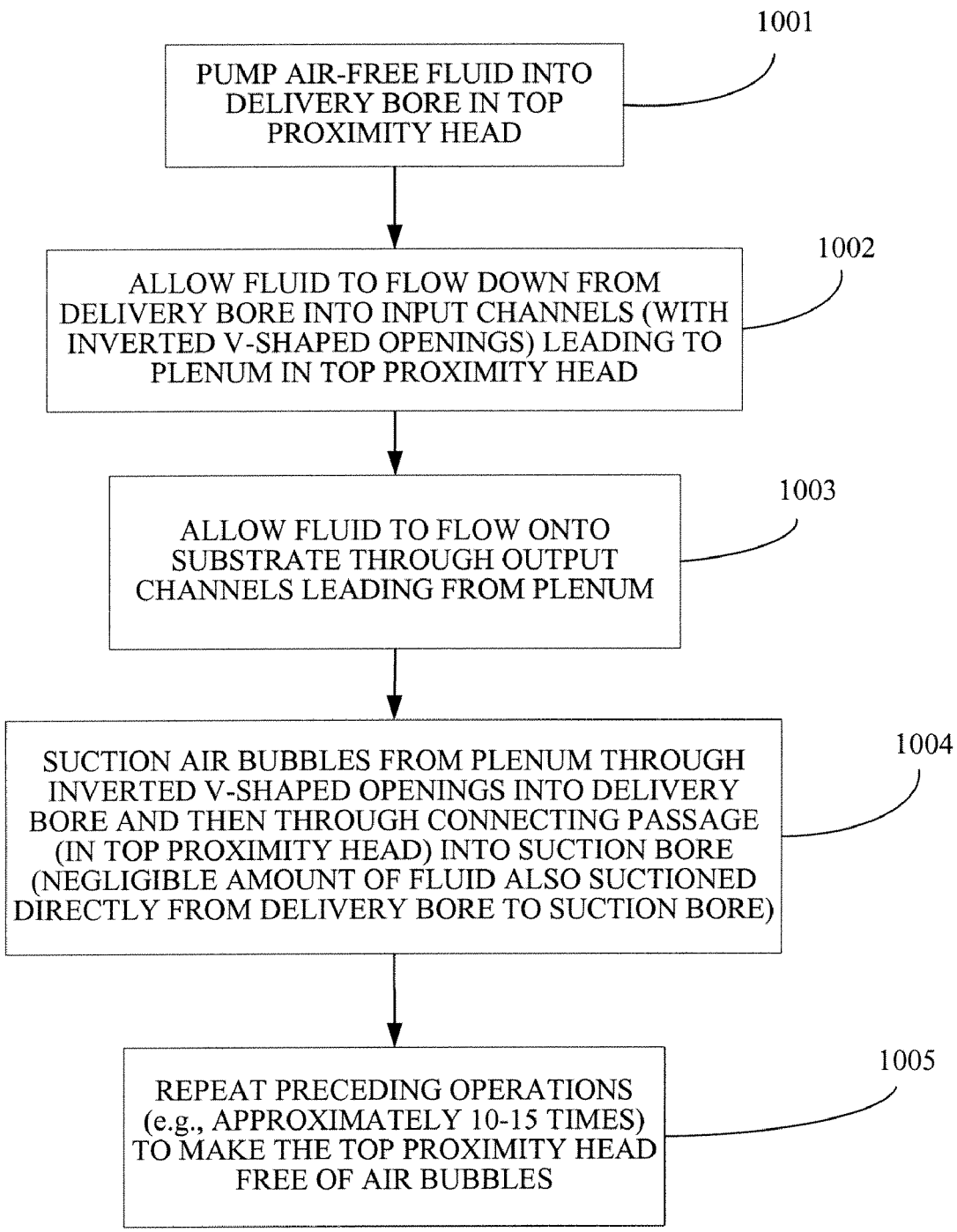
FIG. 10 is a flowchart diagram of a process for removing air bubbles from a fluid flowing down from a top proximity head, in accordance with an example embodiment.

FIG. 10 is a flowchart diagram for a process that does not involve a meniscus on the semiconductor wafer, in accordance with an example embodiment. In operation 1001, the system pumps an air-free fluid into the delivery bore in the top proximity head and, in operation 1002, the system allows the fluid to flow down from the delivery bore into input channels leading to a plenum in the top proximity head. In an example embodiment, the input channels end in inverted V-shaped openings which facilitate the upward flow of air bubbles in the plenum. In operation 1003, the system allows the fluid to flow down onto the substrate through output channels leading from the plenum. In operation 1004, the system suctions air bubbles from the plenum through the inverted V-shaped openings into the delivery bore and then through a connecting passage into a suction bore. During this operation, a negligible amount of fluid flows directly from the delivery bore into the suction bore rather than into the plenum. In operation 1005 of the process, the system repeats operations 1001 through 1004 approximately 10-15 times to make the top proximity head free of air bubbles. Once made free of air bubbles, the top proximity head might remain in that state (e.g., full of fluid) for several hours despite idle time between fluid deliveries.

Here again, the number of alternating cycles in operation 1005 might be dependent upon the delivery flow rate, e.g., a large flow rate requires a smaller number of alternating cycles to make the top proximity head free of air bubbles. In an example embodiment, the fluid delivery flow rate might be approximately 1.5 liter per minute, though alternative example embodiments might handle smaller (e.g., approximately 1 liter per minute) and larger (e.g., approximately 2.4 liter per minute) delivery flow rates.

Although the foregoing example embodiments have been described in some detail for purposes of clarity of understanding, it will be apparent that certain changes and modifications may be practiced within the scope of the appended claims. Thus, the system might use shapes other than an inverted V-shape to urge air bubbles upwards, in alternative example embodiments. Or the gas to be eliminated by the system might be a gas other than air. Alternatively, the proximity head might not be a component in a spin wet system, rather than a linear wet system. Accordingly, the example embodiments are to be considered as illustrative and not restrictive, and the invention is not to be limited to the details given herein, but may be modified within the scope and equivalents of the appended claims.

What is claimed is:

1. An apparatus for removing air bubbles from a fluid, comprising:
   a delivery passage, in a head, which receives a fluid from a source outside the head;
   a plenum, in the head, connected to input channels that allow the fluid to flow down from the delivery passage into the plenum, wherein each of the input channels has an inverted V-shaped opening into the plenum to urge any air bubbles in the plenum to flow upwards through the inverted V-shaped opening and wherein each inverted V-shaped opening is directly adjacent to another inverted V-shaped opening;
   output channels, in the head, that allow the fluid to flow down from the plenum onto a substrate which is a semiconductor wafer;
   a return passage, in the head, which provides suction from a source outside of the head; and
   a connecting passage, in the head, which connects the delivery passage and the return passage and which allows an amount of fluid to flow from the delivery passage to the return passage, wherein the amount is small in comparison to the total amount of fluid flowing from the delivery passage to the plenum.

2. The apparatus of claim 1, further comprising return channels in the head that connect to the return passage, wherein the return channels suction the fluid from the substrate.

3. The apparatus of claim 1, wherein an angle between a side of the inverted V-shaped opening and a line bisecting the inverted V-shaped opening is less than 60 degrees.

4. The apparatus of claim 1, wherein an angle between a side of the inverted V-shaped opening and a line bisecting the inverted V-shaped opening is approximately 45 degrees.

5. The apparatus of claim 1, wherein the head forms a meniscus on a substrate.

6. The apparatus of claim 1, wherein the fluid is an etching fluid.

7. The apparatus of claim 1, wherein the fluid is a fluid selected from the group consisting of cleaning fluids and rinsing fluids.

8. The apparatus of claim 1, wherein the fluid is a fluid which performs Marangoni drying.

* * * * *